United States Patent
Schustereder et al.

(10) Patent No.: US 9,613,805 B1
(45) Date of Patent: Apr. 4, 2017

(54) METHOD FOR FORMING A SEMICONDUCTOR DEVICE

(71) Applicant: Infineon Technologies AG, Neubiberg (DE)

(72) Inventors: Werner Schustereder, Villach (AT);
Holger Schulze, Villach (AT);
Johannes Laven, Taufkirchen (DE);
Roman Baburske, Otterfing (DE);
Rudolf Berger, Regensburg (DE);
Thomas Gutt, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/966,640

(22) Filed: Dec. 11, 2015

(51) Int. Cl.
*H01L 21/02* (2006.01)

(52) U.S. Cl.
CPC .. *H01L 21/02694* (2013.01); *H01L 21/02592* (2013.01); *H01L 21/02595* (2013.01); *H01L 21/02675* (2013.01)

(58) Field of Classification Search
CPC ......... H01L 21/02694; H01L 21/02592; H01L 21/02595; H01L 21/02675
USPC ....................................................... 438/487
See application file for complete search history.

(56) References Cited

U.S. PATENT DOCUMENTS

| | | | | |
|---|---|---|---|---|
| 3,901,738 A | * | 8/1975 | Hunsperger | H01L 21/26546 148/DIG. 56 |
| 5,026,654 A | * | 6/1991 | Tanba | H01L 21/28525 257/370 |
| 2002/0058366 A1 | * | 5/2002 | Miyasaki | H01L 21/2026 438/166 |
| 2009/0267200 A1 | | 10/2009 | Gutt | |

FOREIGN PATENT DOCUMENTS

DE  102006053182 B4  1/2015

OTHER PUBLICATIONS

"IGBT-Module, FZ1500R33HE3," Technical Information, Infineon, Dec. 11, 2013, 9 pp.

(Continued)

*Primary Examiner* — Caleen Sullivan
(74) *Attorney, Agent, or Firm* — Shumaker & Sieffert, P.A.

(57) ABSTRACT

A method for forming a semiconductor device comprises forming an amorphous or polycrystalline semiconductor layer adjacently to at least one semiconductor doping region having a first conductivity type located in a semiconductor substrate. The method further comprises incorporating dopants into the amorphous or polycrystalline semiconductor layer during or after forming the amorphous or polycrystalline semiconductor layer. The method further comprises annealing the amorphous or polycrystalline semiconductor layer to transform at least a part of the amorphous or polycrystalline semiconductor layer into a substantially monocrystalline semiconductor layer and to form at least one doping region having the second conductivity type in the monocrystalline semiconductor layer, such that a p-n junction is formed between the at least one semiconductor doping region having the first conductivity type and the at least one doping region having the second conductivity type.

22 Claims, 8 Drawing Sheets

(56) References Cited

OTHER PUBLICATIONS

Biermann et al., "CIBH Diode with Superior Soft Switching Beheavior in 3.3kV Modules for Fast Switching Applications," Infineon Editorial, Jun. 6, 2008, 5 pp.

Celler et al., "Seeded oscillatory growth of Si over SiO2 by cw laser irradiation," Applied Physics Letters, vol. 40, No. 12, Jun. 15, 1982, pp. 1043-1045.

Jiang et al., "Band-to-Band Tunneling Injection Insulated-Gate Bipolar Transistor with a Soft Reverse-Recovery Built-In Diode," IEEE Electron Device Letters, vol. 33, No. 12, Dec. 2012, pp. 1684-1686.

* cited by examiner

METHOD FOR FORMING A SEMICONDUCTOR DEVICE

TECHNICAL FIELD

Embodiments relate to concepts for forming semiconductor device structures, and in particular to a method for forming a semiconductor device.

BACKGROUND

With common semiconductor processes, sharp profiles (e.g. p-n junctions) cannot be generated particularly at larger depths. A similar situation may also apply for manufacturing an epitaxial layer. The doping of the epitaxial layer may experiences strong out diffusion due to the high temperature budget of subsequent processes, especially since the epitaxial process is carried out at the beginning of the manufacturing process of the components.

SUMMARY

Some embodiments relate to a method for forming a semiconductor device. The method comprises forming an amorphous or polycrystalline semiconductor layer adjacently to at least one semiconductor doping region having a first conductivity type located in a semiconductor substrate. The method further comprises incorporating dopants into the amorphous or polycrystalline semiconductor layer during or after forming the amorphous or polycrystalline semiconductor layer. The method further comprises annealing the amorphous or polycrystalline semiconductor layer to transform at least a part of the amorphous or polycrystalline semiconductor layer into a substantially monocrystalline semiconductor layer and to form at least one doping region having the second conductivity type in the monocrystalline semiconductor layer, such that a p-n junction is formed between the at least one semiconductor doping region having the first conductivity type and the at least one doping region having the second conductivity type.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
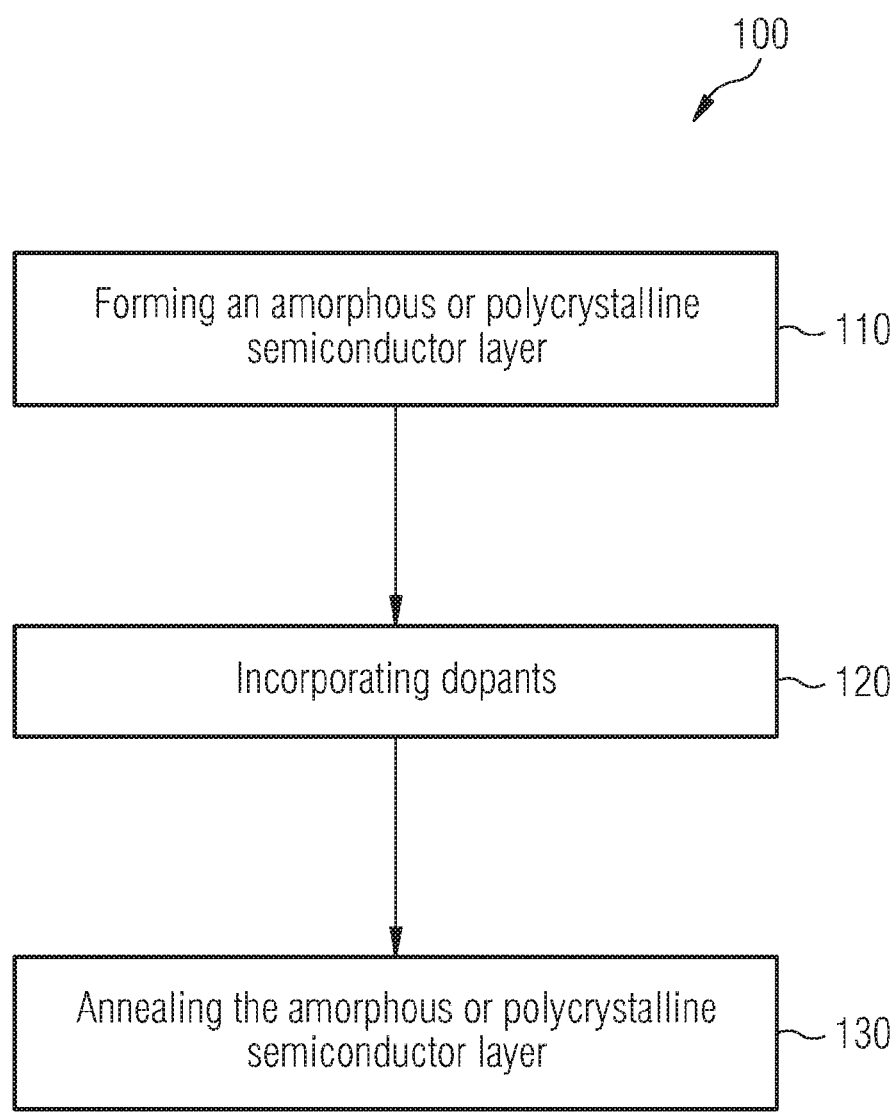
FIG. 1 shows a flow chart of a method for forming a semiconductor device.

FIG. 1 shows a flow chart of a method 100 for forming a semiconductor device according to an embodiment.

The method 100 comprises forming 110 an amorphous or polycrystalline semiconductor layer adjacently to at least one semiconductor doping region having a first conductivity type located in a semiconductor substrate.

The method 100 further comprises incorporating 120 dopants into the amorphous or polycrystalline semiconductor layer during or after forming the amorphous or polycrystalline semiconductor layer.

The method 100 further comprises annealing 130 the amorphous or polycrystalline semiconductor layer to transform at least a part of the amorphous or polycrystalline semiconductor layer into a substantially monocrystalline semiconductor layer and to form at least one doping region having the second conductivity type in the monocrystalline semiconductor layer, such that a p-n junction is formed between the at least one semiconductor doping region having the first conductivity type and the at least one doping region having the second conductivity type.

Due to the incorporating 120 of dopants into the amorphous or polycrystalline semiconductor layer and annealing 130 of the amorphous or polycrystalline semiconductor layer, sharp and deep p-n junctions may be formed. Furthermore, stability against avalanche conditions and/or resistance against surge currents may be improved, for example.

The amorphous or polycrystalline semiconductor layer may be an amorphous silicon layer (e.g. an amorphous α-silicon layer), or alternatively, a polysilicon layer, for example. Alternatively or optionally, other suitable amorphous semiconductor layers or polycrystalline semiconductor layers may be used.

The amorphous or polycrystalline semiconductor layer may be formed at (or on) a lateral surface of the semiconductor substrate. For example, the amorphous or polycrystalline semiconductor layer may be formed at (or on) a back side surface (e.g. a back side lateral surface) of the semiconductor substrate. The amorphous or polycrystalline semiconductor layer may cover most of the (back side) surface of the semiconductor substrate. For example, optionally, the amorphous or polycrystalline semiconductor layer may be formed on more than 50% (or e.g. more than 80%, or e.g. more than 90%, or e.g. substantially all) of the back side surface of the semiconductor substrate.

The amorphous or polycrystalline semiconductor layer may have a (average) thickness of less than 1 μm (or e.g. less than 800 nm, or e.g. less than 500 nm, or e.g. between 400 nm and 700 nm, or e.g. larger than 50 nm, or e.g. larger than 100 nm, or e.g. larger than 200 nm). The average thickness of the amorphous or polycrystalline semiconductor layer may be a measured distance between a first lateral surface of the amorphous or polycrystalline semiconductor layer and a second lateral surface of the amorphous or polycrystalline semiconductor layer arranged directly adjacently to the surface of the semiconductor substrate averaged over a number of measurements, for example.

Optionally, the amorphous or polycrystalline semiconductor layer may be formed by sputtering or by chemical vapor deposition (CVD).

The (or each, or the at least one) semiconductor doping region (first junction doping region) having the first conductivity type is located in (or within) the semiconductor substrate. For example, the semiconductor doping region having the first conductivity type may be located in the semiconductor substrate (directly) at the (back side) lateral surface of the semiconductor substrate. Thus, the amorphous or polycrystalline semiconductor layer formed at the (back side) surface of the semiconductor substrate may be formed (directly) adjacently to the semiconductor doping region having the first conductivity type located in a semiconductor substrate.

The (or each, or the at least one) semiconductor doping region having the first conductivity type may have an average net doping concentration of at least $1*10^{17}$ dopants per $cm^3$ (or e.g. at least than $1*10^{18}$ dopants per $cm^3$, or e.g. at least than $1*10^{19}$ dopants per $cm^3$, or e.g. between $1*10^{14}$ dopants per $cm^3$ and $5*10^{19}$ dopants per $cm^3$, or e.g. between $1*10^{14}$ dopants per $cm^3$ and $1*10^{18}$ dopants per $cm^3$, or e.g. between $1*10^{15}$ dopants per $cm^3$ and $1*10^{17}$ dopants per $cm^3$). The average net doping concentration may be a measured number of dopants per volume averaged over the semiconductor doping region, for example.

The at least one semiconductor doping region may be (or may refer to) one semiconductor doping region or to one or more (e.g. a plurality of semiconductor doping regions), for example. Optionally, the semiconductor doping region having the first conductivity type may be the only doping region or (e.g. the doping region having the largest lateral dimension) arranged at the surface (back side) of the semiconductor substrate. Optionally, the semiconductor doping region having the first conductivity type may be a drift region or a field stop region of a field effect transistor structure or a diode structure, for example. Alternatively or optionally, the semiconductor doping region having the first conductivity type may be one of a plurality of semiconductor doping regions having the first conductivity type laterally distributed in the semiconductor substrate at the surface (back side) of the semiconductor substrate (e.g. in a controlled injection of backside holes (CIBH) structure). It may be understood that features and examples described herein with respect to a (or the) semiconductor doping region may relate to each semiconductor doping region of a plurality of semiconductor doping regions or to a single semiconductor doping region, for example.

The dopants (which cause the second conductivity type) may be incorporated 120 into the amorphous or polycrystalline semiconductor layer by ion implantation after the forming of the amorphous or polycrystalline semiconductor layer, for example. Optionally, an implantation dose for implanting the dopants causing the second conductivity type may be greater than $1*10^{13}$ doping ions per $cm^2$ (or e.g. greater than $1*10^{14}$ doping ions per $cm^2$ or e.g. greater than $1*10^{15}$ doping ions per $cm^2$ or e.g. greater than $1*10^{16}$ doping ions per $cm^2$), for example. Optionally, an implantation energy for implanting the dopants causing the second conductivity type may be higher than 20 keV (or higher than 200 keV or higher than 500 keV or higher than 1000 keV or even higher than 3000 MeV), for example.

The dopants causing the second conductivity type may be incorporated into the amorphous or polycrystalline semiconductor layer such that an average doping concentration of the (or each) semiconductor doping region having the second conductivity type (after annealing) is at least $1*10^{17}$ dopants per $cm^3$ (or e.g. between $1*10^{17}$ dopants per $cm^3$ and $5*10^{19}$ dopants per $cm^3$, or e.g. between $1*10^{18}$ dopants per $cm^3$ and $1*10^{19}$ dopants per $cm^3$). The average doping concentration may be a measured number of dopants per volume averaged over the (or each) semiconductor doping region having the second conductivity type, for example.

Optionally, the dopants causing the second conductivity type may be incorporated into the amorphous or polycrystalline semiconductor layer without using a masking structure. For example, the dopants causing the second conductivity type may be incorporated into the amorphous or polycrystalline semiconductor without specific patterning. For example, an implantation surface area of the amorphous or polycrystalline semiconductor layer exposed to implantation may be substantially equal to (or e.g. more than 95% of, or e.g. more than 99% of) the surface area of the amorphous or polycrystalline semiconductor layer.

Optionally, the dopants causing the second conductivity type may be incorporated 120 (e.g. implanted) into the amorphous or polycrystalline semiconductor layer through a masking structure to form a plurality of (junction) doping regions in the amorphous or polycrystalline semiconductor layer. Through a masked implantation, the doping concentration of the deposited amorphous or polycrystalline semiconductor layer may be laterally structured (or varied).

Alternatively or optionally, the dopants causing the second conductivity type may be incorporated into the amorphous or polycrystalline semiconductor layer in-situ during the forming of the amorphous or polycrystalline semiconductor layer (e.g. by CVD).

A (maximum) penetration depth of the incorporated dopants causing the second conductivity type may be equal to or less than or larger than a thickness of the amorphous or polycrystalline semiconductor layer. For example, a (maximum) penetration depth of the incorporated dopants causing the second conductivity type may be less than 1.0 μm (or e.g. less than 1.0 μm, or e.g. less than 900 nm, or e.g. less than 600 nm, or e.g. between 400 nm and 1.0 μm). The maximum penetration depth may be a largest distance range traveled (or reached) by the incorporated dopants causing the second conductivity type from an entry (or implantation) surface into the amorphous or polycrystalline semiconductor layer and/or the semiconductor substrate, measured in a substantially perpendicular or orthogonal direction to the lateral entry surface of the amorphous or polycrystalline semiconductor layer.

A (first) portion of the dopants causing the second conductivity type incorporated at the entry surface of the amorphous or polycrystalline semiconductor layer may penetrate into a depth equal to or less than the thickness of the amorphous or polycrystalline semiconductor layer. For example, a majority (or e.g. more than 50%, or e.g. more than 70%, or e.g. more than 80%) may be located at a depth equal to or less than a thickness of the amorphous or polycrystalline semiconductor layer after the incorporation of the dopants. For example, a maximum of a dopant distribution profile of the incorporated dopants may lie within the amorphous or polycrystalline semiconductor layer.

A (second) portion (e.g. not more than 5%, or e.g. not more than 10%, or e.g. not more than 20%,) of the dopants causing the second conductivity type incorporated at the entry surface of the amorphous or polycrystalline semiconductor layer may penetrate into a depth larger than the thickness of the amorphous or polycrystalline semiconductor layer. For example, more than 5% of the incorporated dopants may be located at a depth deeper than the amorphous or polycrystalline semiconductor layer after the incorporation of the dopants. Thus, dopants causing the second conductivity type may be incorporated into the amorphous or polycrystalline semiconductor layer and into the semiconductor substrate (e.g. into the adjacent semiconductor doping region having the first conductivity type in the semiconductor substrate), for example.

The amorphous or polycrystalline semiconductor layer may be annealed 130 by light induced annealing, for example. The light induced annealing 130 of the amorphous or polycrystalline semiconductor layer may be carried out by laser thermal annealing LTA (e.g. melt mode laser thermal annealing or e.g. non-melt mode laser thermal annealing) or alternatively, flash lamp annealing. An energy density applied to the amorphous or polycrystalline semiconductor layer (and/or to portions of the semiconductor doping region within the annealing depth) by the light induced annealing 130 may lie between 0.5 Joules per $cm^2$ and 10 Joules per $cm^2$ (or e.g. between 0.5 Joules per $cm^2$ and 4 Joules per $cm^2$) for example. The light induced annealing (by flash lamp annealing and/or laser thermal annealing) may be controlled to heat the amorphous or polycrystalline semiconductor layer within the annealing depth (caused by the light induced annealing) at a rate of at least 500° C. per 10 ms (or e.g. at least 800° C. per 10 ms), for example.

In flash lamp annealing, a light beam having an energy of between 0.5 Joules per $cm^2$ and 10 Joules per $cm^2$ may be directed towards the amorphous or polycrystalline semiconductor layer for at least one annealing time interval. Alternatively to LTA, through processing may be carried through flash lamp annealing. Outgassing from the amorphous or polycrystalline semiconductor layer may be spread over a longer time and/or reduced, for example.

In laser thermal annealing, a pulsed laser light beam having an energy of between 0.5 Joules per $cm^2$ and 10 Joules per $cm^2$ may be directed towards the amorphous or polycrystalline semiconductor layer for at least one annealing time interval. Optionally, the amorphous or polycrystalline semiconductor layer may be annealed by the light induced annealing during a plurality of annealing time intervals (pulse intervals) to form the at least one doping region. For example, each annealing time interval may be between 10 ns and 40 ms (or e.g. between 10 ns and 20 ms), for example. Optionally, the number of annealing time intervals (e.g. the number of pulses) may be greater than one (or e.g. between one and ten, or e.g. between one and four), for example. The magnitude of each annealing time interval of the plurality of annealing time intervals may be the same or different from each other, for example.

A temperature of the amorphous or polycrystalline semiconductor layer (and/or of portions of the semiconductor doping region within the annealing depth) caused by the light induced annealing may greater than or equal to a melting point of the amorphous or polycrystalline semiconductor layer. The light induced annealing may be controlled to melt and recrystallize the amorphous or polycrystalline semiconductor layer within the annealing depth caused by the light induced annealing. For example, the light induced annealing may be controlled to melt and recrystallize completely (or e.g. more than 80% of, or e.g. more than 90% of) the amorphous or polycrystalline semiconductor layer within the annealing depth. The light induced annealing transforms at least part of (e.g. completely, or e.g. more than 80% of, or e.g. more than 90% of) the amorphous or polycrystalline semiconductor layer into a substantially monocrystalline semiconductor layer.

Optionally or alternatively, the amorphous or polycrystalline semiconductor layer may be annealed by non-melt laser thermal annealing. For example, a laser energy density may be used which does not melt the amorphous or polycrystalline semiconductor layer. The amorphous or polycrystalline semiconductor layer may be annealed by the non-melt laser thermal annealing during a plurality of annealing time intervals (pulse intervals) to form the at least one (junction) doping region. Alternatively to melt-mode LTA, the non-melt mode LTA may be used to activate the implanted layers. For example, multiple processing with lower laser energy density may lead to smoother and/or reduced outgassing (e.g. from the amorphous silicon layer or polycrystalline silicon layer).

The light induced annealing 130 may be controlled such that an annealing depth (or melting depth) caused by the light induced annealing is equal to or larger than a thickness of the amorphous or polycrystalline semiconductor layer. For example, the light induced annealing 130 may cause the amorphous or polycrystalline semiconductor layer and/or a portion of the semiconductor doping region to be annealed (or heated). For example, the annealing depth (or melting depth) may extend past the interface of the amorphous or polycrystalline semiconductor layer by at most 50% (or e.g.

at most 20%, or e.g. at most 10%) of the thickness of the amorphous or polycrystalline semiconductor layer. For example, the annealing depth (or melting depth) may be not more than 50% (or e.g. not more than 20%, or e.g. not more than 10%) larger than the thickness of the amorphous or polycrystalline semiconductor layer.

Optionally, the light induced annealing 130 may be controlled such that the annealing depth (or melting depth) caused by the light induced annealing is less than a maximum penetration depth of the incorporated dopants causing the second conductivity type. For example, deeply penetrating dopants may not be activated by the light induced annealing if they lie deeper in the substrate than the annealing depth. The annealing depth of the light induced annealing may be used to control a depth (or location) of the (metallurgic) p-n junction independently from the depth of penetration of incorporated dopants. Optionally, not more than 30% of the incorporated dopants are located at a depth deeper in the semiconductor substrate than the p-n junction. Optionally, more than 5% (or e.g. more than 10%) of the incorporated dopants located at a depth deeper in the semiconductor substrate than the p-n junction are not activated by the light induced annealing.

After the light induced annealing 130, the dopants causing the second conductivity type within the annealing depth may be activated, and the amorphous or polycrystalline semiconductor layer may be transformed into the monocrystalline semiconductor layer. The at least one (junction) doping region having the second conductivity type may be formed at least partially in the transformed monocrystalline semiconductor layer, for example.

If a doping concentration of the dopants (causing the second conductivity type) incorporated into the semiconductor doping region is greater than a doping concentration of dopants causing the first conductivity type of the semiconductor doping region and if an annealing depth caused by the light induced annealing is larger than a thickness of the amorphous or polycrystalline semiconductor layer (204), the (metallurgic) p-n junction may be formed at a depth larger than a thickness of the amorphous or polycrystalline semiconductor layer. For example, the at least one (junction) doping region having the second conductivity type may extend into a depth larger than the thickness of the amorphous or polycrystalline semiconductor layer.

If a doping concentration of the dopants (causing the second conductivity type) incorporated into the semiconductor doping region is less than a doping concentration of the dopants causing the first conductivity type of the semiconductor doping region and if an annealing depth caused by the light induced annealing is at least equal to a thickness of the amorphous or polycrystalline semiconductor layer (204), the (metallurgic) p-n junction may be formed at an interface between the monocrystalline semiconductor layer and the (or each) semiconductor doping region having the first conductivity type, for example.

The p-n junction is formed between the (or each) semiconductor doping region (first junction doping region) having the first conductivity type and the at least one doping region (second junction doping region) having the second conductivity type. For example, the p-n junction may be formed at the interface directly adjacent and/or directly between the (or each) semiconductor doping region having the first conductivity type and the at least one doping region having the second conductivity type. For example, in the case of the semiconductor doping region being (or referring to) one semiconductor doping region, the p-n junction may be formed between the semiconductor doping region having the first conductivity type and the at least one doping region having the second conductivity type. In the case of the semiconductor doping region being (or referring to) a plurality of semiconductor doping regions, a p-n junction may be formed between each semiconductor doping region having the first conductivity type and the at least one doping region having the second conductivity type.

To achieve a greater (or maximum) doping efficiency, the incorporated dopants (or ions) may have a maximum penetration depth which is less than the thickness of the amorphous or polycrystalline semiconductor layer and less than an annealing depth (or melting depth) caused by the light induced annealing. Annealing (by light induced annealing) of the incorporated dopants having a maximum penetration depth less than the thickness of the amorphous of polycrystalline semiconductor layer may lead to (or cause) the diffusion of the incorporated dopants towards (or to) a transition (or interface) between the amorphous or polycrystalline semiconductor layer and the semiconductor doping region having the first conductivity type, without causing a diffusion of charge carriers in the semiconductor doping region.

The (metallurgic) p-n junction may be a sharp p-n junction. For example, a doping concentration of the doping region having the second conductivity type at a transition (or interface) between the doping region having the second conductivity type and the semiconductor doping region having the first conductivity type may vary between a maximum doping concentration of the doping region having the second conductivity type to less than 5% (or e.g. less than 1%) of the maximum doping concentration of the doping region having the second conductivity type over a distance of less than 500 nm. For example, a doping concentration of the semiconductor doping region having the first conductivity type at a transition (or interface) between the semiconductor doping region having the first conductivity type and the doping region having the second conductivity type may vary between a maximum doping concentration of the semiconductor doping region having the first conductivity type to less than 5% (or e.g. less than 1%) of the maximum doping concentration of the semiconductor doping region having the first conductivity over a distance of less than 500 nm (or e.g. less than 300 nm, or e.g. less than 200 nm, or e.g. even less than 150 nm).

In order that the doping region having the second conductivity type has a desired depth (or vertical dimension), the method 110 may include repeating a series of sequential processes to form the doping region having the second conductivity type. The series of sequential processes may include performing the following processes in sequence (or series): a) forming a (second) amorphous or polycrystalline semiconductor layer adjacently to the (annealed) substantially monocrystalline semiconductor layer, b) incorporating dopants into the amorphous or polycrystalline semiconductor layer during or after forming the amorphous or polycrystalline semiconductor layer, and c) after incorporating the dopants into the amorphous or polycrystalline semiconductor layer, annealing the second amorphous or polycrystalline semiconductor layer by light induced annealing to transform at least a part of the second amorphous or polycrystalline semiconductor layer into a second substantially monocrystalline semiconductor layer and to enlarge the at least one doping region having the second conductivity type into the second monocrystalline semiconductor layer.

The annealing 130 (e.g. light induced annealing 130) may be controlled such that a diffusion of dopants causing the second conductivity type into the at least one semiconductor doping region and/or into other doping regions of the semiconductor substrate is reduced or prevented. For example, the light induced annealing may be controlled such that a diffusion of dopants causing the first conductivity type out of the semiconductor doping region and/or a diffusion of dopants out of other doping regions of the semiconductor substrate is reduced or prevented.

The sequential processes may be repeated until at least one common doping region having the desired vertical dimension comprising a plurality of doping regions having the second conductivity type is formed in the repeatedly formed substantially monocrystalline semiconductor layers, for example.

Optionally, alternatively or additionally, the method 110 may include repeating a series of sequential processes to form alternating doping regions having the first conductivity type and doping regions having the second conductivity type. For example, the method 110 may include forming a second amorphous or polycrystalline semiconductor layer adjacently to the substantially monocrystalline semiconductor layer. The method 110 may further include incorporating dopants (causing the first conductivity type) into the second amorphous or polycrystalline semiconductor layer during or after forming the second amorphous or polycrystalline semiconductor layer. The method 110 may further include annealing the second amorphous or polycrystalline semiconductor layer (by light induced annealing) to transform at least a part of the second amorphous or polycrystalline semiconductor layer into a second substantially monocrystalline semiconductor layer and to form at least one second doping region having the first conductivity type in the second substantially monocrystalline semiconductor layer, such that a second p-n junction is formed between the at least one doping region having the second conductivity type (in the first substantially monocrystalline semiconductor layer) and the at least one second doping region having the first conductivity type (in the second adjacent substantially monocrystalline semiconductor layer).

Optionally, the sequential processes for forming alternating doping regions having the first conductivity type and doping regions having the second conductivity type may be repeated such that a plurality of doping regions having the first conductivity type and a plurality of doping regions having the second conductivity type are arranged alternatingly with respect to each other.

The at least one doping regions having the second conductivity type and the semiconductor doping region having the first conductivity type may be part of a semiconductor device, for example. The semiconductor device may include a metal oxide semiconductor field effect transistor (MOSFET) structure, an insulated gate bipolar transistor (IGBT) structure, a junction field effect transistor (JFET) structure, or a diode structure, for example.

Each MOSFET structure or IGBT structure may include a first source/drain or emitter/collector region located at a first lateral side (e.g. a front side surface) of the semiconductor substrate. A first source/drain or emitter/collector (metallization) contact structure located on the surface of the semiconductor substrate may be electrically connected to the first source/drain or emitter/collector region. The MOSFET structure or IGBT structure may include a body region located between a drift region and the first source/drain or emitter/collector region. The body region may be located adjacently to a transistor gate or transistor gate trench structure.

In the case of the semiconductor device structure being a MOSFET structure, the drift region of the MOSFET structure may be located between a body region of the MOSFET structure and the second source/drain region of the MOSFET structure located at a second lateral side (e.g. a back side surface) of the semiconductor substrate. The first source/drain region and the second source/drain regions of the MOSFET structure may be highly doped regions having the same conductivity type. The drift region of the MOSFET structure may be a low doped region having the same conductivity type as the first source/drain region and the second source/drain regions of the MOSFET structure. The body region may have an opposite (or different) conductivity type as the first source/drain region and the second source/drain regions of the MOSFET structure, for example.

Optionally, the semiconductor doping region having the first conductivity type may be a drift region or a field stop region of a field effect transistor structure or a diode structure, for example.

Optionally, the doping region having the second conductivity type may be the (second) source/drain region of the MOSFET structure, for example. For example, the p-n junction may be formed (or may exist) between the (second) source/drain region (the doping region having the second conductivity type) and the drift region (the semiconductor doping region having the first conductivity type) of the field effect transistor structure (MOSFET structure).

In the case of the semiconductor device structure being an IGBT structure, the drift region of the IGBT structure may be located between a body region of the IGBT structure and a (second) emitter/collector region of the IGBT structure located at the second lateral side (e.g. a back side surface) of the semiconductor substrate. Optionally, the field stop region may be located between the drift region and the second emitter/collector region of the IGBT structure. The first collector/emitter region may be highly doped region having an opposite (or different) conductivity type as the highly doped second collector/emitter region of the IGBT structure. The body region may have an opposite (or different) conductivity type as the first source/drain region. The drift region of the MOSFET structure may be a low doped region having the same conductivity type as the first collector/emitter region of the IGBT structure. The field stop region may have the same conductivity type as the drift region and a higher doping concentration than the drift region, for example.

Optionally, the doping region having the second conductivity type may be the (second) collector/emitter region of the IGBT structure, for example. For example, the p-n junction may be formed (or may exist) between the (second) collector/emitter region (the doping region having the second conductivity type) and the field stop region (the semiconductor doping region having the first conductivity type) of the field effect transistor structure (IGBT structure).

In the case of the semiconductor device structure being a JFET structure, a channel region of the JFET structure may be located between the drift region of the JFET structure and the first source/drain region of the JFET structure located at the first lateral side of the semiconductor substrate. A first source/drain (metallization) contact structure located on the surface of the semiconductor substrate may be electrically connected to the first source/drain region. The drift region of the JFET structure may be located between the channel region of the JFET structure and the second source/drain region of the JFET structure located at the second lateral side (e.g. a back side surface) of the semiconductor substrate.

Optionally, the doping region having the second conductivity type may be the (second) source/drain region of the JFET structure, for example. For example, the p-n junction may be formed (or may exist) between the (second) source/drain region (the doping region having the second conductivity type) and the drift region (the semiconductor doping region having the first conductivity type) of the field effect transistor structure (JFET structure).

In the case of the semiconductor device structure being a diode structure, a first anode/cathode region of the diode structure may be located at the first lateral side of the semiconductor substrate. A first anode/cathode (metallization) contact structure located on the surface of the semiconductor substrate may be electrically connected to the first anode/cathode region. The drift region of the diode structure may be located between the first anode/cathode region of the diode structure and a second anode/cathode region of the diode structure located at the second lateral side (e.g. a back side surface) of the semiconductor substrate. An optional field stop region may be located between the drift region and the second anode/cathode region of the diode. The field stop region may have the same conductivity type as the drift region and a higher doping concentration than the drift region, for example.

Optionally, the doping region having the second conductivity type may be the (second) anode/cathode region of a diode structure, for example. For example, the p-n junction may be formed between the anode/cathode region (the doping region having the second conductivity type) and the drift region (the semiconductor doping region having the first conductivity type) of the diode structure.

In the case of the semiconductor doping region having the first conductivity type being a drift region of a field effect transistor structure or a diode structure, an average doping concentration of the semiconductor doping region may be between $1*10^{14}$ dopants per cm$^3$ and $1*10^{18}$ dopants per cm$^3$ (or e.g. between $1*10^{14}$ dopants per cm$^3$ and $1*10^{16}$ dopants per cm$^3$), for example. In the case of the semiconductor doping region having the first conductivity type being a field stop region of a field effect transistor structure or a diode structure, an average doping concentration of the semiconductor doping region may be larger than the average doping concentration of the drift region. For example, an average doping concentration of the semiconductor doping region may be between $1*10^{14}$ dopants per cm$^3$ and $1*10^{18}$ dopants per cm$^3$ (or e.g. between $1*10^{14}$ dopants per cm$^3$ and $1*10^{16}$ dopants per cm$^3$), for example.

Optionally or alternatively, the semiconductor doping region having the first conductivity type may be a tunneling region of a tunneling injection insulated gate bipolar transistor (TIGT) structure, for example.

A TIGT structure may be similar to an IGBT structure. However, the TIGT structure may further include a highly doped tunneling region between the field stop region and the second collector/emitter region of the IGBT structure. In the case of the semiconductor doping region having the first conductivity type being a tunneling region, an average doping concentration of the semiconductor doping region may be between $1*10^{17}$ dopants per cm$^3$ and $1*10^{20}$ dopants per cm$^3$ (or e.g. between $1*10^{18}$ dopants per cm$^3$ and $1*10^{20}$ dopants per cm$^3$), for example.

A region comprising the first conductivity type may be a p-doped region (e.g. caused by incorporated dopants being aluminum ions, gallium ions or boron ions) or an n-doped region (e.g. caused by incorporated dopants being nitrogen ions, phosphor ions, antimony ions, selenium ions or arsenic ions or bismuth). Consequently, the second conductivity type indicates an opposite n-doped region or p-doped region. In other words, the first conductivity type may indicate a p-doping and the second conductivity type may indicate an n-doping or vice-versa.

A lateral surface or a lateral dimension (e.g. a diameter or a length) of the main surface of the semiconductor structure may be more than 100 times larger (or more than 1000 times or more than 10000 times) than a distance between a first lateral surface of the semiconductor substrate and a second opposite lateral surface of semiconductor substrate, for example. A lateral surface of the amorphous or polycrystalline semiconductor layer may be a surface of the amorphous or polycrystalline semiconductor layer which is parallel to the lateral surface of the semiconductor substrate, for example.

The front side surface of the semiconductor substrate may be a semiconductor surface of the semiconductor substrate towards metal layers, insulation layers or passivation layers on top of the semiconductor surface. In comparison to a basically vertical edge (e.g. resulting from separating the semiconductor substrate from others) of the semiconductor substrate, the surface of the semiconductor substrate may be a basically horizontal surface extending laterally. The surface of the semiconductor substrate may be a basically even plane (e.g. neglecting unevenness of the semiconductor structure due to the manufacturing process or trenches). For example, the front side surface of the semiconductor substrate may be the interface between the semiconductor material and an insulation layer, metal layer or passivation layer on top of the semiconductor substrate. For example, more complex structures may be located at the front side surface of the semiconductor substrate than at the back side of the semiconductor substrate. A back side surface of the semiconductor substrate may be a side or surface of the semiconductor substrate at which a back side metallization contact structure (e.g. a source/drain or collector/emitter or anode/cathode contact structure) covering more than 50% (or e.g. more than 80%) of the back side surface of the semiconductor substrate is to be formed (or is formed).

A vertical direction may be perpendicular or orthogonal to a lateral surface of the semiconductor substrate (or to a lateral surface of the amorphous or polycrystalline semiconductor layer), for example. The implantation surface or entry surface may be the surface (of the semiconductor substrate or a layer) at which the implanted doping ions enter the semiconductor substrate or layer. A doping region formed by the implant of doping ions (e.g. at an end of range region of the doping ion implant) may be located at a depth with respect to an implantation surface used for implanting the doping ions into the semiconductor substrate, for example.

The semiconductor substrate may be a semiconductor wafer, a part of a semiconductor wafer or a semiconductor die. The semiconductor substrate may be a silicon-based substrate (e.g. a silicon (Si) substrate or silicon wafer). Alternatively, the semiconductor substrate of the semiconductor device may be a silicon carbide (SiC) substrate, a gallium arsenide (GaAs) substrate or a gallium nitride (GaN) substrate, for example. The semiconductor substrate may be an epitaxial semiconductor substrate, a Czochralski (CZ) semiconductor substrate, a magnetic CZ semiconductor substrate, or a float zone semiconductor substrate, for example.

The semiconductor device may be a power semiconductor device having a breakdown voltage or blocking voltage of more than more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500

V, 1700V or 2000V) or more than 2000 V (e.g. a breakdown voltage of 3.3 kV, or 4.5 kV or 6.5 kV).

With common semiconductor processes (e.g. implantation and/or annealing), sharp profiles (e.g. p-n junctions) cannot be generated particularly at larger depths. This may be due to the intrinsic broadening of the implantations profile and the doping diffusion during high temperature activation steps.

The method 100 may be used for creating very sharp and deep p-n junctions. For example, very sharp and deep p-n junctions may be formed through the sequential processing of implantation, melting laser thermal annealing (LTA), depositing, implantation, melting laser thermal annealing (LTA) and so forth. In this layering process, the required or desired energy may be introduced vertically to a very exact defined depth by LTA. For example, the method 100 may be used for forming diode structures, FET structures or IGBT structures with sharp and deep p-n junction doping profiles. The method 100 may further be used for forming ultra-flat field stop structures for fast switching IGBTs and diodes or special buffer structures, for example.

The method 100 may be used to form a multi-layer back side emitter structure. To realize a multi-layer back side emitter structure by laser annealing, multiple laser annealing processes with different melting depths may be applied. Alternatively a combination of non-melting and melting laser annealing may be used. The limited effectiveness on the zone near the wafer surface may limit the dopant layer thickness, for example. This may lead to a limited dimensioning of the layers, for example. For example, spiking of the back side metallization may be a problem.

FIGS. 2A to 2F show schematic illustrations of a method for forming a semiconductor device. For example, FIGS. 2A to 2F show a process flow for the generation of deep and sharp p-n junctions.

Figure 2A:
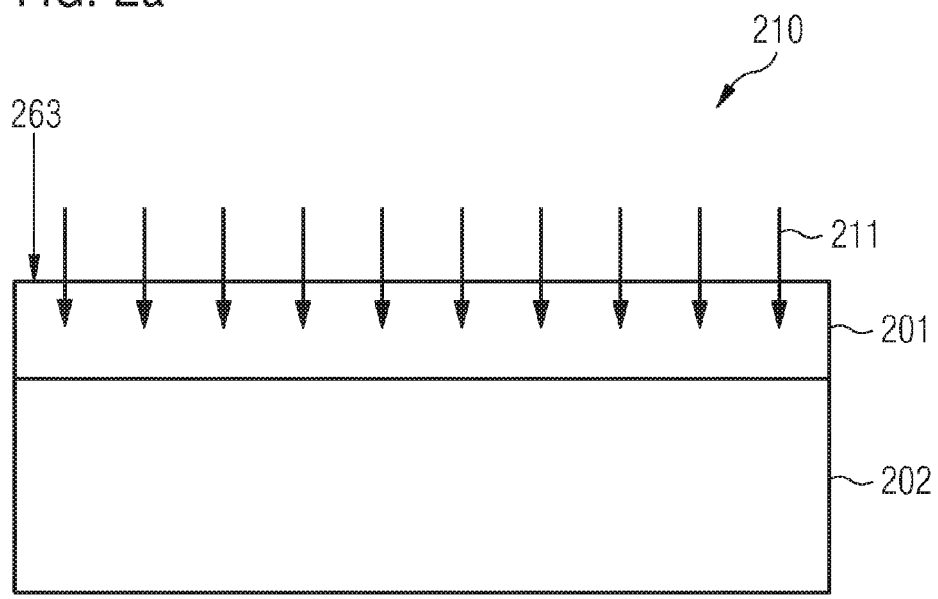
FIGS. 2A to 2F show schematic illustrations of a method for forming a semiconductor device.

FIG. 2A shows a schematic illustration 210 of the incorporating 211 of dopants into a semiconductor doping region 201 of the semiconductor substrate 202. The dopants may be incorporated into the semiconductor doping region 201 of the semiconductor substrate 202 by ion implantation, for example. The dopants incorporated into the semiconductor doping region 201 of the semiconductor substrate 202 may be dopants which may cause the semiconductor doping region 201 to have the first conductivity type after activation of the dopants, for example. For example, the dopants causing the first conductivity type incorporated into the semiconductor doping region 201 of the semiconductor substrate 202 may be aluminum ions, gallium ions or boron ions.

The dopants causing the first conductivity type may be incorporated into the semiconductor doping region 201 of the semiconductor substrate 202 from an entry (or implantation) surface 203 (e.g. from a back side surface or e.g. from a front side surface) of the semiconductor substrate 202, for example.

A (maximum) penetration depth of the incorporated dopants causing the first conductivity type may be less than 1.5 µm (or e.g. less than 1.0 µm, or e.g. less than 900 nm, or e.g. less than 600 nm, or e.g. between 400 nm and 1.0 µm).

Figure 2B:
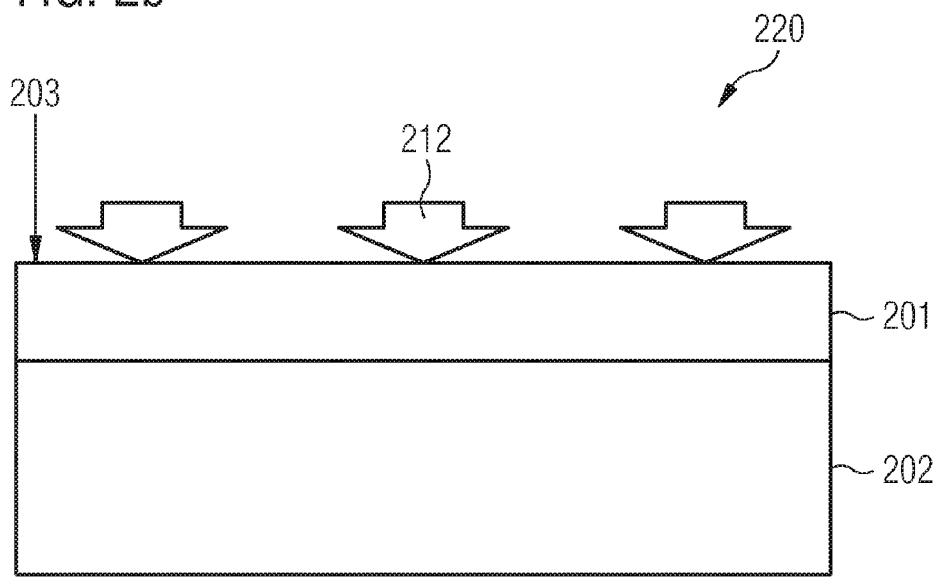

FIG. 2B shows a schematic illustration 220 of the annealing 212 of a region of the semiconductor substrate 202 to form the semiconductor doping region 201 having the first conductivity type (e.g. the first junction doping region of a p-n junction to be formed).

Optionally, the annealing 212 of the region of the semiconductor substrate 202 may be carried out by light induced annealing (e.g. laser thermal annealing, or e.g. flash lamp annealing). Alternatively or optionally, the annealing 212 of the region of the semiconductor substrate 202 may be carried out by rapid thermal annealing, for example.

The annealing 212 of the region of the semiconductor substrate 202 may be controlled such that an annealing depth (or melting depth) caused by the annealing is equal to or larger than the (maximum) penetration depth of the incorporated dopants causing the first conductivity type, for example.

The annealing 212 may cause the dopants causing the first conductivity type incorporated into semiconductor substrate 202 to be activated, and thus forming the semiconductor doping having the first conductivity type. For example, the semiconductor doping region 201 having the first conductivity type may be a p-doped region.

The annealing 212 of a region of the semiconductor substrate 202 to form the semiconductor doping region 201 having the first conductivity type may be carried out before forming an amorphous or polycrystalline semiconductor layer adjacently to the semiconductor doping region 201.

Figure 2C:
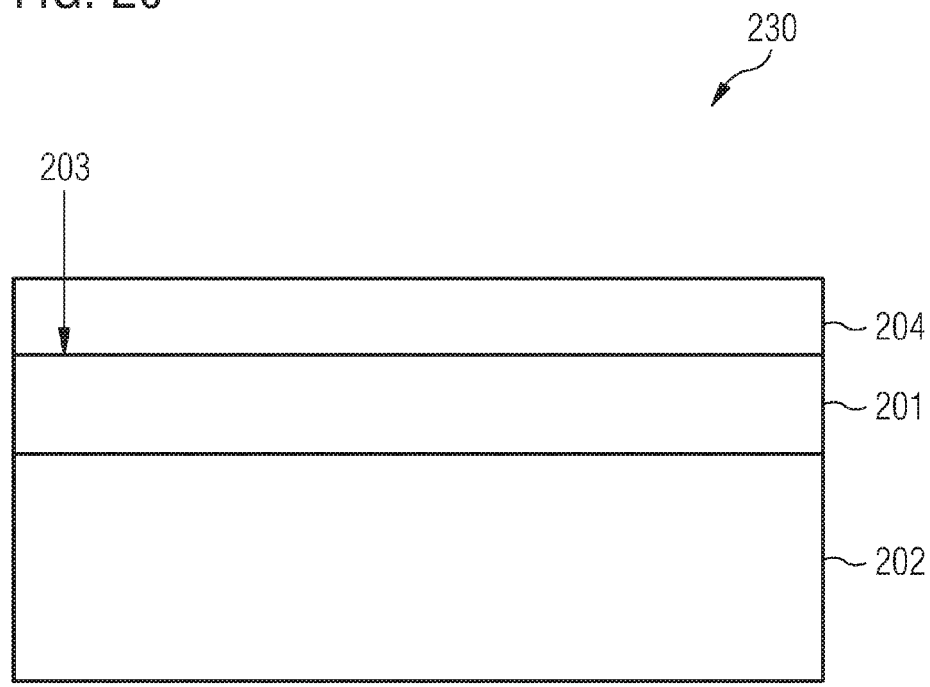

FIG. 2C shows a schematic illustration 230 of the forming of an amorphous or polycrystalline semiconductor layer 204 adjacently to the semiconductor doping region 201 having the first conductivity type located in the semiconductor substrate 202.

The amorphous or polycrystalline semiconductor layer 204 may be formed at (or on) a back side surface 203 (e.g. a back side lateral surface) of the semiconductor substrate 202, for example. The amorphous or polycrystalline semiconductor layer 204 may be formed directly adjacently to the semiconductor doping region 201 having the first conductivity type, for example.

Optionally, the amorphous or polycrystalline semiconductor layer 204 may be formed by sputtering. The method may include an outgassing process carried out after forming the amorphous or polycrystalline semiconductor layer 204 and before annealing the amorphous or polycrystalline semiconductor layer (by light induced annealing). The outgassing process may be carried out by heating the amorphous or polycrystalline semiconductor layer 204 and/or the semiconductor substrate 202 at temperatures of less than 600° C. (or e.g. between 350° C. and 400° C.). Optionally, the outgassing process may be carried out in a vacuum environment at temperatures of less than 400° C. for less than 10 hours (e.g. between 1 hour to 4 hours). Optionally, the process may be carried out with minimal gas inclusion. For example, argon (Ar) may be used as a process gas instead of hydrogen (H).

Alternatively, the amorphous or polycrystalline semiconductor layer 204 may be formed by a chemical vapor deposition (CVD) process. An outgassing process may be carried out after the CVD process to form (or grow) the amorphous or polycrystalline semiconductor layer 204 and before annealing the amorphous or polycrystalline semiconductor layer (by light induced annealing), for example. In-situ doping to incorporate the dopants may be possible, and thus an additional implantation process may be eliminated, for example.

The process variations described herein for the generation of the activation layer (the amorphous or polycrystalline semiconductor layer 204) by sputtering or CVD with outgassing process may be used to reduce outgassing of the activation layer, for example. For example, outgassing from low temperature deposited Si layers due to melting (meltmode) laser thermal annealing may be reduced or avoided. Optionally, the outgassing process may be avoided if non-melt mode laser thermal annealing is used for the annealing of the amorphous or polycrystalline semiconductor layer.

Figure 2D:
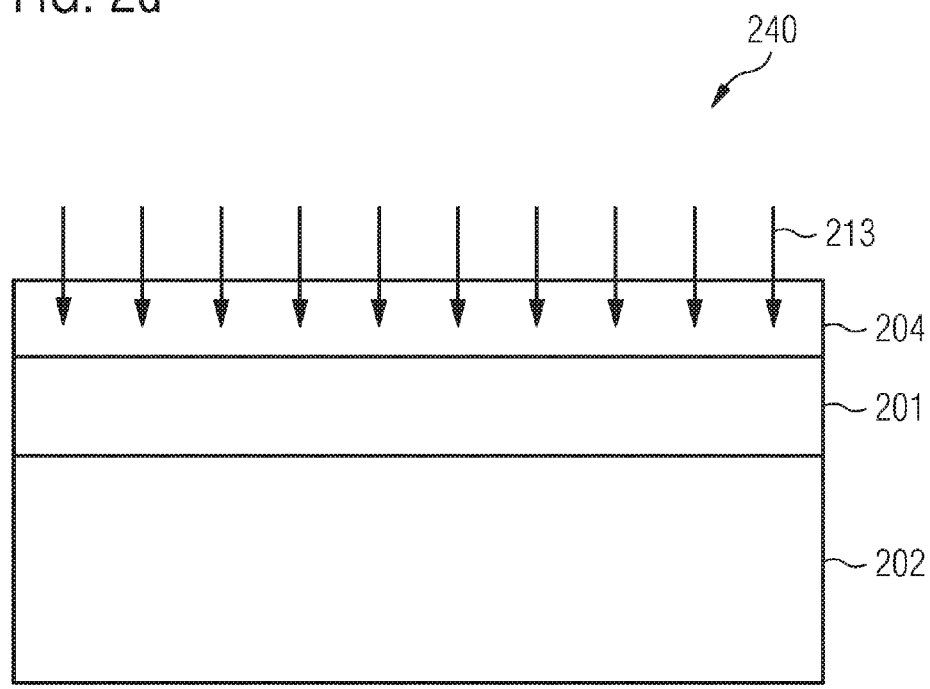

FIG. 2D shows a schematic illustration 240 of the incorporating 213 of dopants into the amorphous or polycrystalline semiconductor layer 204.

Optionally, the dopants may be incorporated 213 into the amorphous or polycrystalline semiconductor layer during (in-situ) the forming the amorphous or polycrystalline semiconductor layer 204. Optionally, the dopants may be incorporated 213 into the amorphous or polycrystalline semiconductor layer 204 by ion implantation after forming the amorphous or polycrystalline semiconductor layer 204.

The dopants incorporated into the amorphous or polycrystalline semiconductor layer 204 may be dopants which may cause the amorphous or polycrystalline semiconductor layer 204 to have the second conductivity type after activation of the dopants, for example. For example, the dopants incorporated into the amorphous or polycrystalline semiconductor layer 204 of the semiconductor substrate 202 causing the second conductivity type may be different from the dopants causing the first conductivity type of the semiconductor doping region 201. For example, the dopants incorporated into the amorphous or polycrystalline semiconductor layer 204 of the semiconductor substrate 202 causing the second conductivity type may be phosphorus, antimony ions, selenium ions, nitrogen or arsenic dopants.

A (maximum) penetration depth of the incorporated dopants causing the second conductivity type may be equal to or less than, or larger than a thickness of the amorphous or polycrystalline semiconductor layer. For example, a (maximum) penetration depth of the incorporated dopants causing the second conductivity type may be less than 1.0 µm (or e.g. less than 1.0 µm, or e.g. less than 900 nm, or e.g. less than 600 nm, or e.g. between 400 nm and 1.0 µm).

Figure 2E:
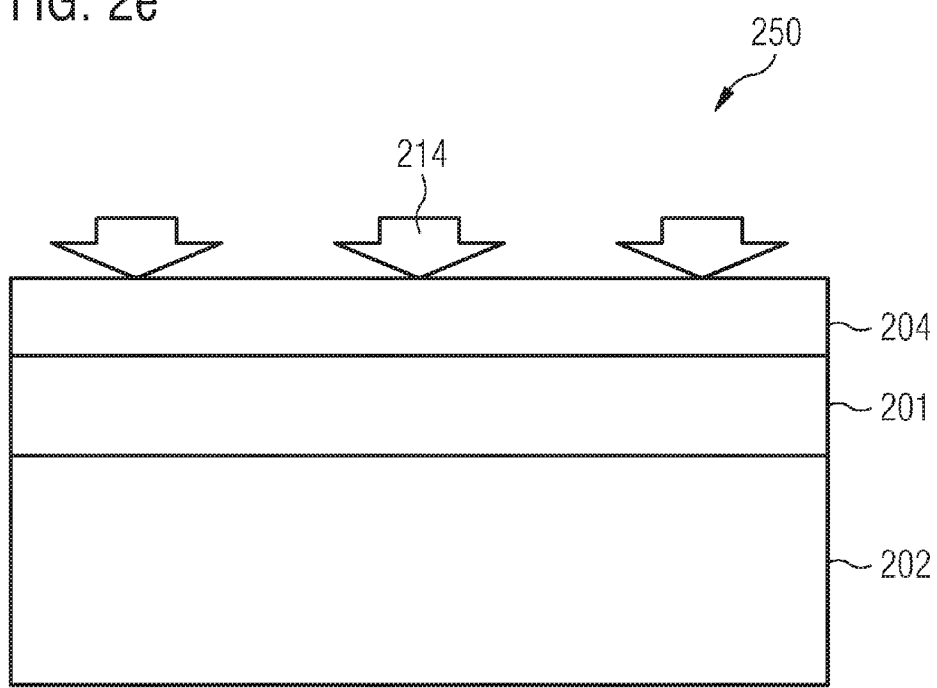

FIG. 2E shows a schematic illustration 250 of the annealing 214 of the amorphous or polycrystalline semiconductor layer by light induced annealing (e.g. by laser thermal annealing, or e.g. by flash lamp annealing).

The light induced annealing 214 may be controlled such that an annealing depth caused by the light induced annealing is equal to or larger than a thickness of the amorphous or polycrystalline semiconductor layer. Optionally, the light induced annealing 214 may be controlled such that the annealing depth caused by the light induced annealing is equal to the (maximum) penetration depth of the incorporated dopants (or not more than 5% larger than the maximum penetration depth of the incorporated dopants), for example.

The annealing 214 of the amorphous or polycrystalline semiconductor layer transforms at least a part of the amorphous or polycrystalline semiconductor layer into a substantially monocrystalline semiconductor layer. Additionally, the annealing 214 of the amorphous or polycrystalline semiconductor layer forms at least one doping region having the second conductivity type (e.g. at least one second junction doping region of the p-n junction) in the monocrystalline semiconductor layer. For example, the at least one doping region having the second conductivity type may be an n-doped region.

Figure 2F:
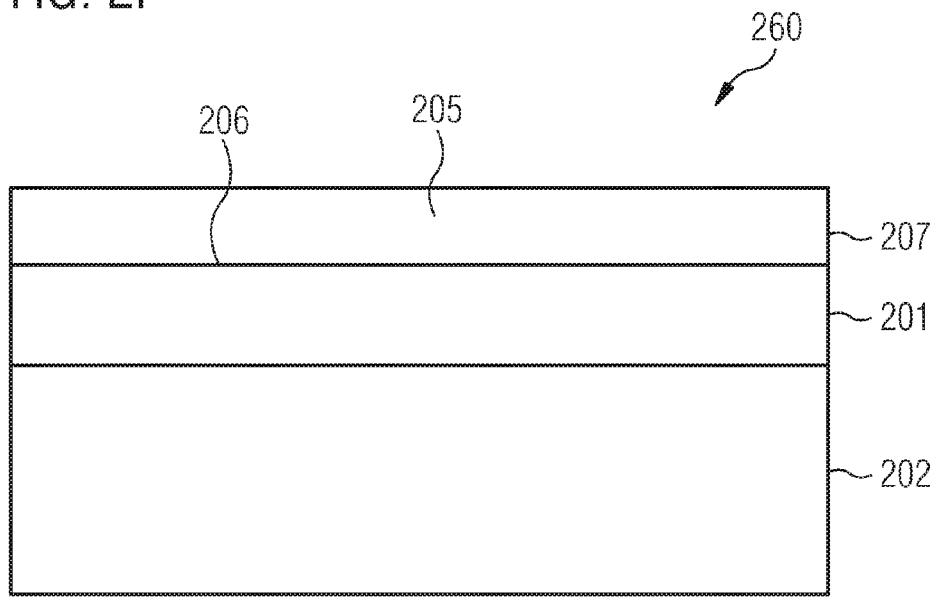

FIG. 2F shows a schematic illustration 260 of a p-n junction 206 formed between the semiconductor doping region 201 having the first conductivity type (e.g. the p-doped junction doping region) and the at least one doping region 205 having the second conductivity type (e.g. the n-doped junction doping region).

The annealing of the amorphous or polycrystalline semiconductor layer forms the at least one doping region 205 having the second conductivity type at least partially in the recrystallized monocrystalline semiconductor layer 207. For example, the at least one doping region 205 having the second conductivity type may be an n-doped region.

As shown in FIG. 2F, the p-n junction 206 may be formed at an interface between the monocrystalline semiconductor layer 207 and the semiconductor doping region 201 having the first conductivity type, for example. This may occur if a doping concentration of the dopants (causing the second conductivity type) incorporated into the semiconductor doping region 201 (during 214) is less than a doping concentration of the dopants (incorporated during 211) causing the first conductivity type of the semiconductor doping region 201.

Optionally or alternatively, if a (maximum) penetration depth of the incorporated dopants causing the second conductivity type is larger than a thickness of the amorphous or polycrystalline semiconductor layer, and if a doping concentration of the dopants (causing the second conductivity type) incorporated into the semiconductor doping region 201 (during 214) is greater (or larger) than a doping concentration of dopants (incorporated during 211) causing the first conductivity type of the semiconductor doping region 201, the p-n junction 206 may be formed at a depth larger than a thickness of the amorphous or polycrystalline semiconductor layer. For example, the at least one doping region having 205 the second conductivity type may extend into a depth larger than the thickness of the amorphous or polycrystalline semiconductor layer.

More details and aspects are mentioned in connection with the embodiments described above or below. The embodiments shown in FIGS. 2A to 2F may comprise one or more optional additional features corresponding to one or more aspects mentioned in connection with the proposed concept or one or more embodiments described above (e.g. FIG. 1) or below (e.g. FIGS. 3 to 5B).

Figure 3:
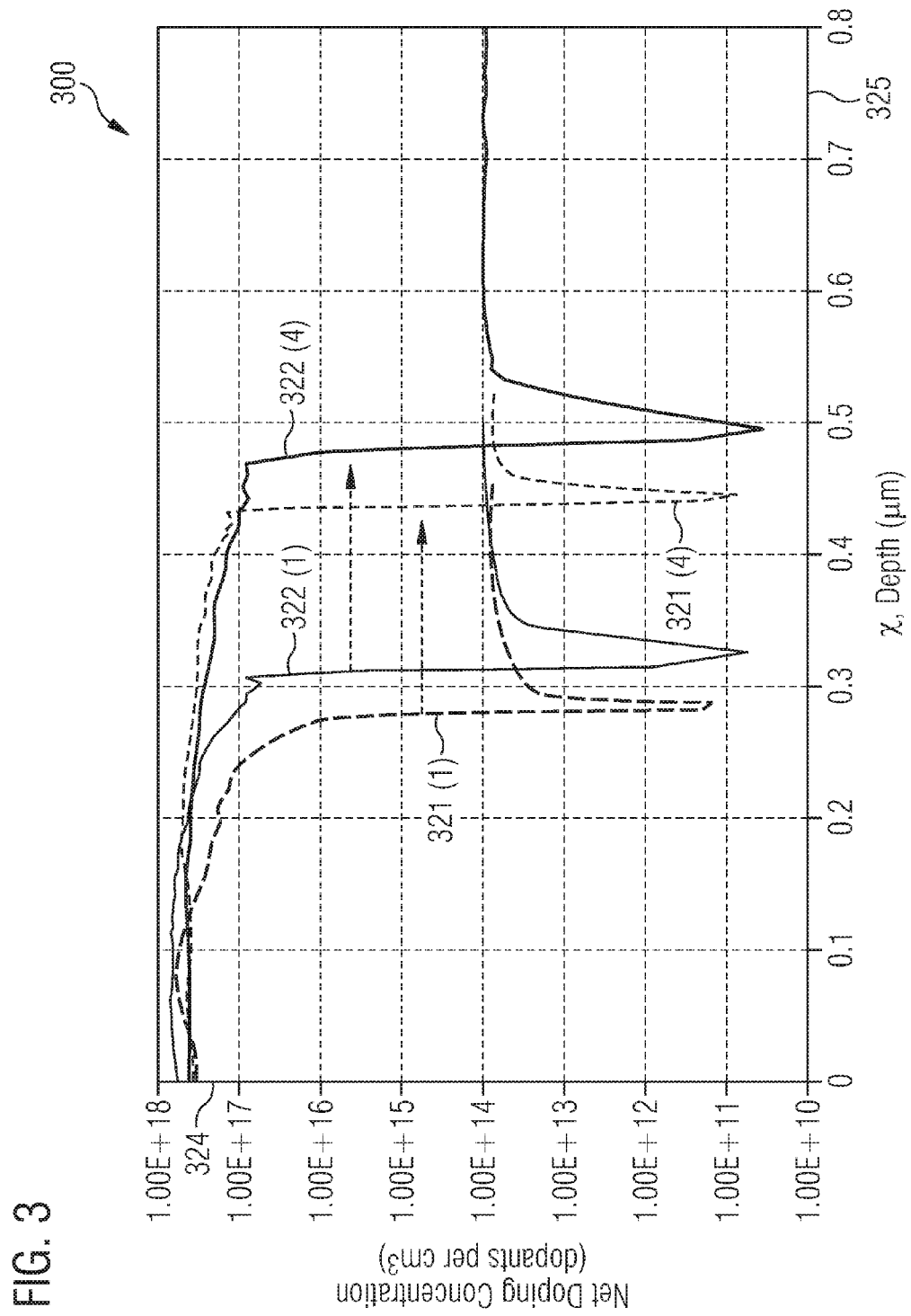
FIG. 3 shows a diagram of a doping concentration (dopants per $cm^3$) versus depth ($\mu m$) at a p-n junction based on laser thermal annealing process parameters.

FIG. 3 shows a diagram 300 of a net doping concentration profile (dopants per $cm^3$) 324 versus depth (µm) 325 of a p-n junction based on different possible laser thermal annealing (LTA) process parameters which may be used for the light induced annealing of the amorphous or polycrystalline semiconductor layer. FIG. 3 shows melting depths of the amorphous or polycrystalline semiconductor layer in response to different LTA process parameters, and the formation of sharp vertical p-n junctions with different LTA process parameters, for example.

In the LTA processes, the amorphous or polycrystalline semiconductor layer may be annealed by the light induced annealing during a plurality of (consecutive) annealing time intervals (pulse intervals).

Using the first possible LTA process parameters 321, a first energy density applied to the amorphous or polycrystalline semiconductor layer by the laser may be 3.6 Joules per $cm^2$, for example. FIG. 3 shows the doping concentration 321(1) after one annealing laser pulse is applied with the first energy density and the doping concentration 321(4) after four annealing laser pulses are applied with the first energy density.

Using the second possible LTA process parameters 322, a second energy density applied to the amorphous or polycrystalline semiconductor layer by the laser may be 4 Joules per $cm^2$, for example. FIG. 3 shows the doping concentration 322(1) after one annealing laser pulse is applied with the second energy density and the doping concentration 322(4) after four annealing laser pulses are applied with the second energy density.

The annealing depth increases (e.g. proportionally) with increasing energy density, for example. For example, a vertical dimension of the doping region having the second conductivity type applied with one laser pulse at the second energy density (between 0.3 µm and 0.4 µm) is larger than a vertical dimension of the doping region having the second conductivity type applied with one laser pulse at the first energy density (between 0.2 µm and 0.3 µm).

The vertical dimension of the doping region having the second conductivity type may be a (substantially vertical) distance (or distance) from an entry or implantation surface of the semiconductor device to the depth at which the doping concentration of the doping region having the second conductivity type falls to less than 5% (or e.g. less than 1%) of a maximum doping concentration of the doping region having the second conductivity type. For example, the vertical dimension of the doping region having the second conductivity type applied with one laser pulse at the first energy density may be the depth at which the doping concentration of the doping region is less than 5% (or e.g. less than 1%) of the maximum doping concentration of about $5*10^{17}$ dopants per $cm^3$.

With each of the applied energy densities, the annealing depth increases (e.g. proportionally) with the number of annealing laser pulses applied to the amorphous or polycrystalline semiconductor layer increases, for example. Furthermore, the vertical dimension of the doping region having the second conductivity type also increases (e.g. proportionally) with the number of annealing laser pulses applied to the amorphous or polycrystalline semiconductor layer, for example.

For example, a vertical dimension of the doping region having the second conductivity type after four annealing laser pulses applied with the first energy density 321(4) (between 0.4 µm and 0.5 µm) is larger than a vertical dimension of the doping region having the second conductivity type after one annealing laser pulse applied with the first energy density 321(1) (between 0.2 µm and 0.3 µm).

For example, a vertical dimension of the doping region having the second conductivity type after four annealing laser pulses applied with the second energy density 322(4) (between 0.4 µm and 0.5 µm) is larger than a vertical dimension of the doping region having the second conductivity type after one annealing laser pulse applied with the second energy density 322(1) (between 0.3 µm and 0.4 µm).

A silicon (or amorphous or polycrystalline silicon layer) near a top surface of the semiconductor substrate may be melted with a 4 Joules per $cm^2$ energy density of the laser to a depth of about 400 nm, for example. This may lead to a homogeneous spreading of the incorporated dopants, for example. LTA may melt (completely) the amorphous or polycrystalline deposited Si layers at low temperatures. In this way, they may recrystallize with monocrystallinity, for example. The melting depth may be set through the laser energy and the structure of the silicon, for example. For example, LTA process parameters for crystalline silicon (c-Si) having a melting point 1420° C. may be about 1.7 Joules per $cm^2$. LTA process parameters are for amorphous silicon (a-Si) having a melting point 1150° C. may be about 0.7 Joules per $cm^2$, for example.

Through an appropriate choice of laser energy, only the deposited layer may be melted, or additionally a part of the underlying substrate may also be melted. Based on the low temperature budget of the melting LTA process, the dopant activation in the underlying, non-melted substrate is practically not influenced, for example. With the described method, complex doping profiles may be realized through a repeating of any number of the processes of silicon deposition and LTA. However, the doping profiles do not diffuse into each other due to the low temperature budget.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1 to 2F) or below (e.g. FIGS. 4A to 5B).

Figure 4A:
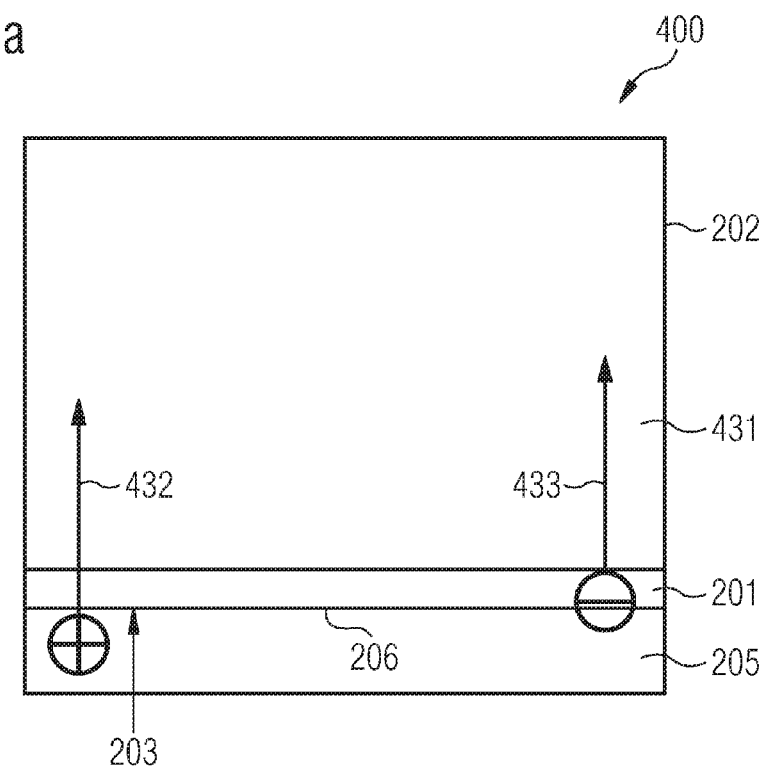
FIG. 4A shows a schematic illustration of a semiconductor device including a tunneling injection insulated gate bipolar transistor structure.

FIG. 4A shows a schematic illustration of a semiconductor device 400 including a tunneling injection insulated gate bipolar transistor (TIGT) structure. The back side of the TIGT structure may be an alternative back side for reverse conducting (RC) IGBTs, for example.

The TIGT structure of the semiconductor device 400 may include a p-n junction 206 formed between the semiconductor doping region 201 having the first conductivity type and the doping region 205 having the second conductivity type.

The doping region 205 having the second conductivity type may be a (second) collector/emitter region of the TIGT structure located at a lateral surface (or e.g. at the back side surface 203) of the semiconductor substrate 202, for example. The doping region 205 having the second conductivity type may be arranged (directly) adjacently to a sharp p-n junction formed between the doping region 205 having the second conductivity type and the semiconductor doping region 201 having the first conductivity type.

The semiconductor doping region 201 having the first conductivity type may be a tunneling region (or a tunnel layer) of the TIGT structure, for example. The tunneling region may be arranged (directly) between a field stop region 431 of the TIGT structure and the doping region 205 having the second conductivity type, for example.

The doping region 205 having the second conductivity type may be a highly doped p-type region (e.g. a p-emitter/collector) having an average doping concentration of between $1*10^{17}$ dopants per $cm^3$ and $1*10^{20}$ dopants per $cm^3$ (or e.g. between $1*10^{18}$ dopants per $cm^3$ and $1*10^{20}$ dopants per $cm^3$), for example.

The semiconductor doping region 201 having the first conductivity type may be a highly doped n-type region (e.g. a n-emitter/collector) having an average doping concentration of between $1*10^{17}$ dopants per $cm^3$ and $1*10^{20}$ dopants per $cm^3$ (or e.g. between $1*10^{18}$ dopants per $cm^3$ and $1*10^{20}$ dopants per $cm^3$), for example.

If the (second) collector/emitter region of the TIGT structure is forward biased, holes 432 may be injected from the (second) collector/emitter region 205 of the TIGT structure into the field stop region 431 of the TIGT structure and into a drift region of the TIGT structure. If the (second) collector/emitter region of the TIGT structure is reverse biased, electrons 433 may tunnel from the (second) collector/emitter region 205 of the TIGT structure into the tunneling region 201 of the TIGT and into the drift region of the TIGT structure.

Figure 4B:
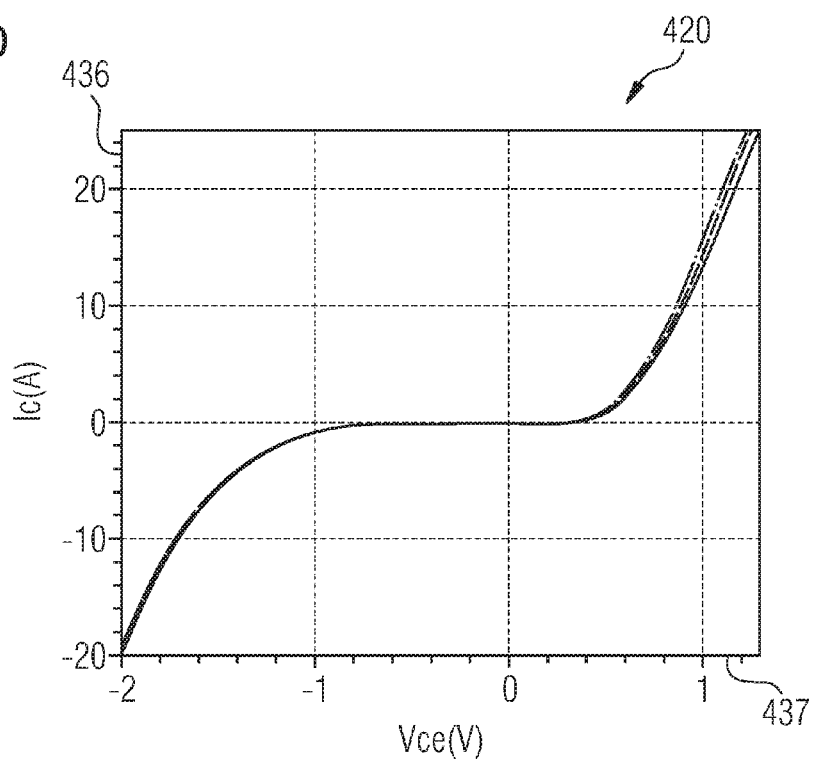
FIG. 4B shows a diagram of collector current Ic (Amperes) versus collector-emitter voltage Vce (Volts) of the tunneling injection insulated gate bipolar transistor structure.

FIG. 4B shows a diagram 420 of collector current Ic (Amperes) 436 versus collector-emitter voltage Vce (Volts) 437 at 473K corresponding to the doping concentration profile described in connection with FIG. 4C.

In the IGBT operation of the semiconductor device 400, holes may be injected from the highly doped p-emitter (e.g. the doping region 205 having the second conductivity type) into the drift region, for example. In diode operation, the p-n junction between the highly doped p-region (e.g. the doping region 205 having the second conductivity type) and the n-region (e.g. the semiconductor doping region 201 having the first conductivity type) is polarized in the reverse direction, for example. If the electric field strength at the p-n junction reaches a critical value, avalanche generation may occur and electrons may be injected into the drift region. The conditions for avalanche generation may be reached at a voltage of over 5V, so that the forward voltage becomes prohibitively large. The electron injection through band to band tunneling occurs at significantly lower voltage drops through the realization of a very highly doped region. Then, the characteristic may be realized without snapback characteristics in the IGBT and diode quadrant as shown in FIG. 4C. In both operation modes, the whole active area may be used. Thus, the costly back side lithography may be saved, for example.

The TIGT structure prevents or reduces challenges associated with reverse conducting IGBTs. For reverse conducting IGBTs, the p region (p-type collector/emitter) at the collector side may be interrupted by the n region (the field stop region). The n-region (the field stop region) may inject electrons in the reverse conduction operation which generates a charge carrier plasma in the drift region. However, the n-region may provide electrons carried from the front side MOS cell (in IGBT forward operation) with a unipolar path to the collector, which may prevent the building of a charge carrier plasma particular at low currents. To counteract this, the p region must be wide enough. In the 1200V voltage class, for a snap-back free output characteristic, the ignition region must be at least 300 µm wide, and significantly larger than the thickness of the IGBT (e.g. 110 µm). Thus, a part of the active region is not available for the current conduction in the diode operation, for example. This may be critical particularly in applications with a strong power regenerative feedback operation and/or in applications with high requirements for surge current resistance, for example.

Figure 4C:
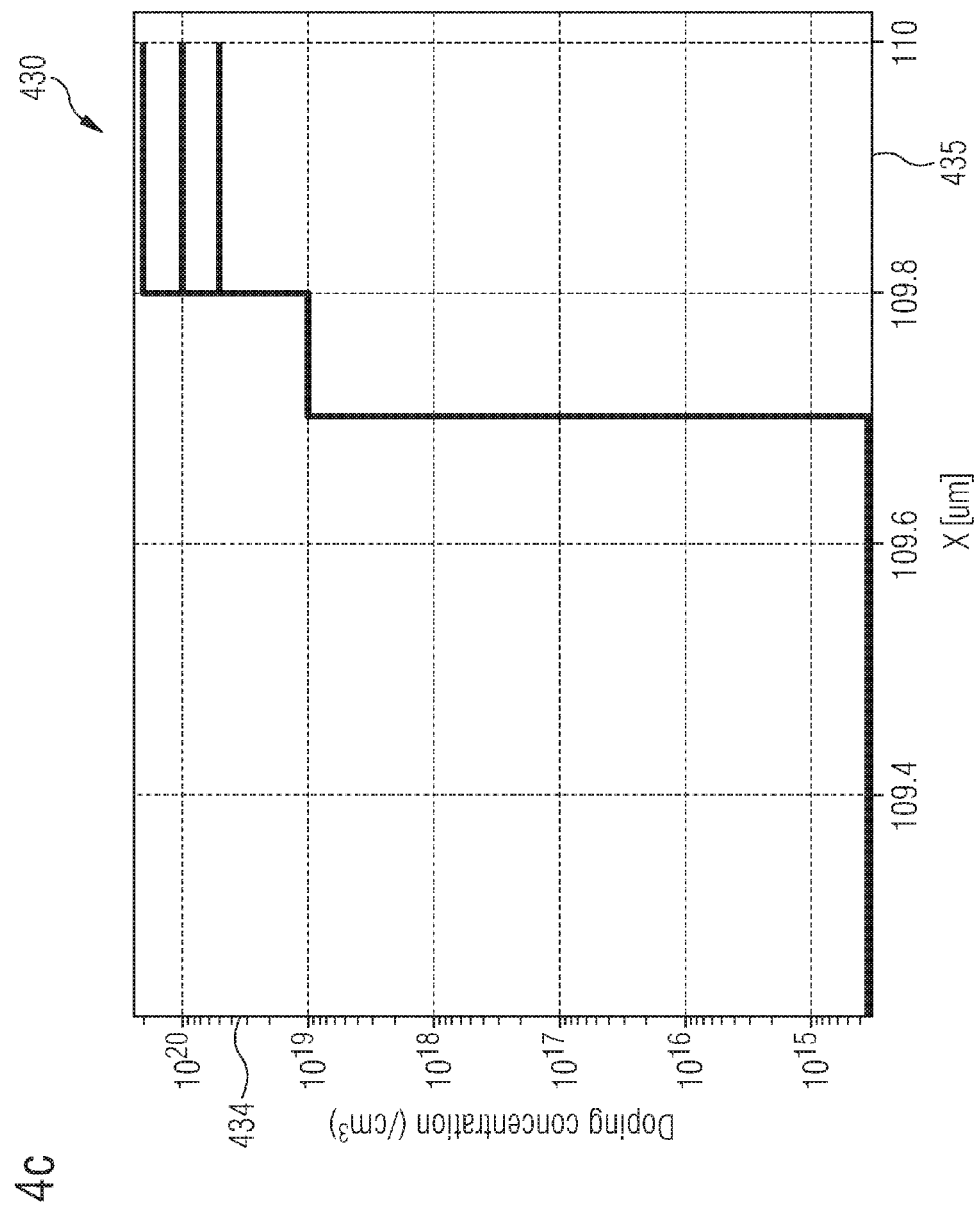
FIG. 4C shows a diagram of a doping concentration (dopants per $cm^3$) versus distance ($\mu m$) of the tunneling injection insulated gate bipolar transistor structure.

FIG. 4C shows a diagram 430 of a doping concentration (dopants per $cm^3$) 434 versus distance (µm) 435. For example, FIG. 4C shows a vertical simulated doping profile of the back side of the semiconductor substrate.

As shown in FIG. 4C, a doping concentration of the doping region 205 having the second conductivity type (at a distance of between 109.8 µm and 110 µm) may lie between $1*10^{19}$ dopants per $cm^3$ and $1*10^{20}$ dopants per $cm^3$, for example. A doping concentration of the semiconductor doping region 201 having the first conductivity type (at a distance of between x=109.7 µm and x=109.8 µm) may be about $1*10^{19}$ dopants per $cm^3$, for example. A doping concentration of the field stop region 431 having the first conductivity type (at a distance of less than x=109.7 µm) may be less than $1*10^{15}$ dopants per $cm^3$, for example. A (second) collector/emitter contact structure (e.g. a collector contact) may be located at a back side surface of the semiconductor substrate at x=110 µm, for example. The distance, x, may be measured from the front side surface of the semiconductor substrate, for example.

More details and aspects are mentioned in connection with the embodiments described above or below. The embodiments shown in FIGS. 4A to 4C may comprise one or more optional additional features corresponding to one or more aspects mentioned in connection with the proposed concept or one or more embodiments described above (e.g. FIGS. 1 to 3) or below (e.g. FIGS. 5A to 5B).

Figure 5A:
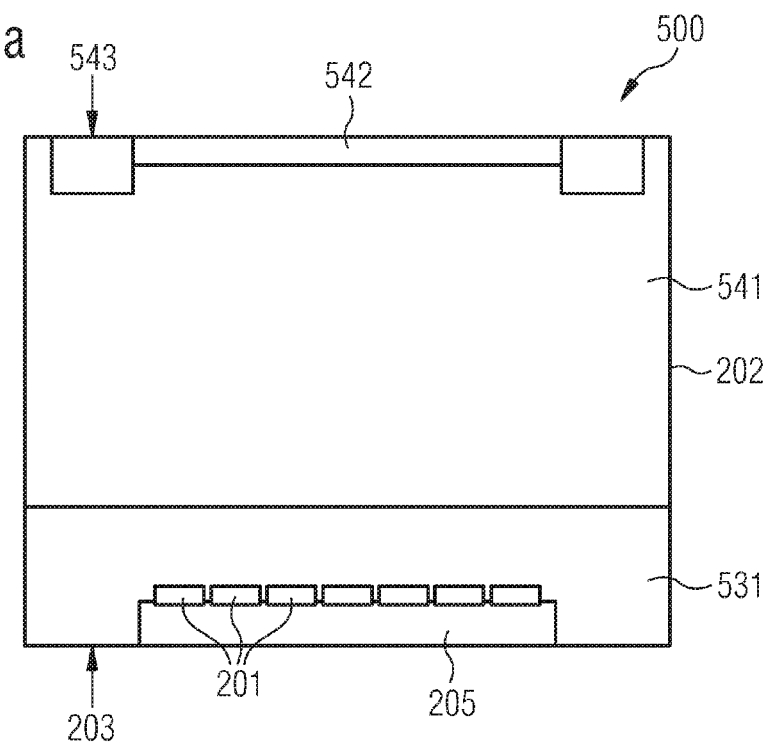
FIG. 5A shows a schematic illustration of a semiconductor device including a controlled injection of backside holes (CIBH) structure.

FIG. 5A shows a schematic illustration of a semiconductor device 500 including a controlled injection of backside holes (CIBH) diode structure.

The semiconductor device 500 may include a plurality of semiconductor doping regions 201 having the first conductivity type laterally distributed in the semiconductor substrate 202. For example, the plurality of semiconductor doping regions 201 may be laterally distributed along the (back side) surface 203 of the semiconductor substrate 202. Optionally, the plurality of semiconductor doping regions 201 having the first conductivity type may be laterally distributed within a field stop region 531 of the semiconductor device 500. Portions of the field stop region 531 may be located (laterally) between the laterally distributed plurality of semiconductor doping regions 201 at the (back side) surface 203 of the semiconductor substrate 202. Alternatively or optionally, the plurality of semiconductor doping regions 201 may be separated from a drift region of a diode structure or FET structure of the semiconductor device by a field stop region 531 of the diode structure or FET structure of the semiconductor device. For example, the field stop region 531 may be located between the plurality of semiconductor doping regions 201 and the drift region. Optionally, a low doped region (having a similar concentration to the concentration of the drift region) may be located between the field stop region 531 of the diode structure or FET structure and the plurality of semiconductor doping regions 201. Optionally, portions of the low doped region may be located (laterally) between the laterally distributed plurality of semiconductor doping regions 201, for example.

The doping region 205 having the second conductivity type may be a (second) anode/cathode region of the CIBH diode structure. The doping region 205 having the second conductivity type may be located at the (back side) surface 203 of the semiconductor substrate 202. The doping region 205 having the second conductivity type may be formed adjacently to the plurality of semiconductor doping regions 201 having the first conductivity type laterally distributed within the field stop region 531 of the CIBH diode structure. For example, the plurality of semiconductor doping regions 201 having the first conductivity type may be located between the doping region 205 having the second conductivity type and the field stop region 531 of the CIBH diode structure.

The CIBH diode structure may further include a drift region 541 located between the field stop region 531 and a first anode/cathode region 542 of the CIBH diode structure 500 located at the opposite lateral surface 543 (front side surface) of the semiconductor substrate 202. The drift region 541 may be arranged (directly) adjacently to the field stop region 531 and to the first anode/cathode region 542 of the diode structure 500, for example.

Optionally, the field stop region 531 may be a n-type doped region, the plurality of semiconductor doping regions 201 having the first conductivity type may be p-type doped islands and the doping region 205 having the second conductivity type may be a highly doped n-type doped emitter region, for example.

To improve the softness of commuting a free-wheeling diode, the n-doped back side emitter may be formed on the p-doped layer (or on one or more p-doped islands or structures). The diode structure may be formed in processed wafers (e.g. on 6 inch diameter wafers or larger) in a long thin wafer process. In this process, the p-doping diffuses in deeper through a conventional oven process, than the n-doped emitter. A transfer of this process to an 8 inch diameter wafer provides the short thin wafer process with an activation of the back side doping layer by laser annealing. An activation of the dopants with conventional oven process is not possible here, for example. The CIBH diode structure or p-island structure may be realized with a 3.3 kV EC3 diode, for example.

Optionally, the semiconductor device 500 may include an IGBT structure. The IGBT structure may also include the active CIBH back side structure including the plurality of semiconductor doping regions having the second conductivity type laterally distributed in the field stop region. For example, in an IGBT structure the p-doped layer (or the plurality of p-doped structures) may be located in the n-buffer (field stop) region of the IGBT structure, for example.

Figure 5B:
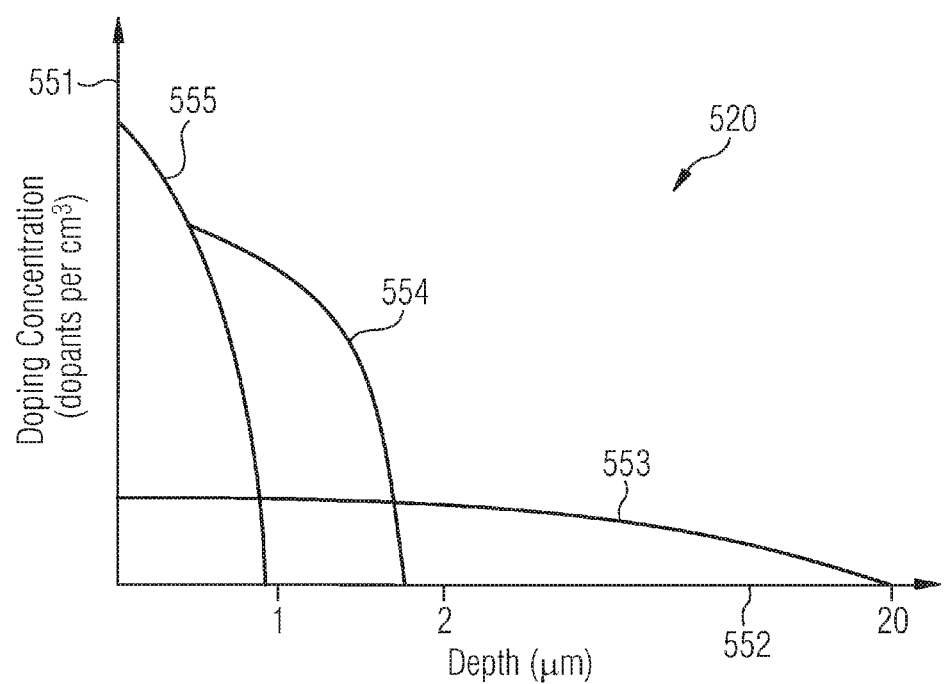
FIG. 5B shows a diagram of a doping concentration (dopants per $cm^3$) versus distance ($\mu m$) of part of the controlled injection of backside holes (CIBH) structure.

FIG. 5B shows a diagram 520 of a doping concentration (dopants per $cm^3$) 551 versus distance (µm) 552 of part of the semiconductor device 500. For example, FIG. 5B shows a schematic cross section and doping profile of the device back side of a free-wheeling diode with a CIBH structure, for example.

Line 553 shows a doping concentration profile of the field stop region 531, for example. The field stop region 531 may have an opposite conductivity type to the plurality of semiconductor doping regions 201. For example, the field stop region 531 may be a n-type doped region having an average doping concentration of between $1*10^{14}$ dopants per $cm^3$ and $1*10^{18}$ dopants per $cm^3$ (or e.g. between $1*10^{14}$ dopants per $cm^3$ and $1*10^{16}$ dopants per $cm^3$), for example.

Line 554 shows a doping concentration profile of a semiconductor doping region 201 (e.g. a p-type island) of the plurality of semiconductor doping regions 201 having the first conductivity type, for example. The plurality of semiconductor doping regions 201 having the first conductivity type may be p-type doped islands having an average doping concentration of between $1*10^{16}$ dopants per $cm^3$ and $1*10^{18}$ dopants per $cm^3$ (or e.g. between $1*10^{17}$ dopants per $cm^3$ and $1*10^{18}$ dopants per $cm^3$), for example. A maximum doping concentration of the semiconductor doping region 201 having the first conductivity type may be greater than a maximum doping concentration of the field stop region 531, for example.

Line 555 shows a doping concentration profile of the doping region 205 having the second conductivity type, for example. The doping region 205 having the second conductivity type may be a highly doped n-type doped emitter region having an average doping concentration of between $1*10^{17}$ dopants per $cm^3$ and $1*10^{20}$ dopants per $cm^3$ (or e.g. between $1*10^{18}$ dopants per $cm^3$ and $1*10^{20}$ dopants per $cm^3$), for example. A maximum doping concentration of the doping region 205 having the second conductivity type may be greater than a maximum doping concentration of the semiconductor doping region 201 having the first conductivity type, for example.

More details and aspects are mentioned in connection with the embodiments described above or below. The embodiments shown in FIGS. 5A and 5B may comprise one or more optional additional features corresponding to one or more aspects mentioned in connection with the proposed concept or one or more embodiments described above (e.g. FIGS. 1 to 4C) or below.

Various examples relate to realizing deep and sharp p-n junctions, for example. The various examples relate to process methods for generating complex doping profiles (e.g. on the back side of thin wafer components), and particularly for generating deep, vertical, and very sharp p-n junctions, for example.

Various examples relate to a computer readable storage medium having stored thereon a program having a program code for performing the methods described herein (e.g. in FIGS. 1 to 5B), when the program is executed on a computer or processor.

Aspects and features (e.g. the amorphous or polycrystalline semiconductor layer, the semiconductor device, the semiconductor device structure, the semiconductor substrate, the semiconductor doping region having a first conductivity type, the at least one doping region having the second conductivity type, the monocrystalline semiconductor layer, the p-n junction, the light induced annealing, the flash lamp annealing, the annealing depth, the penetration depth) mentioned in connection with one or more specific examples may be combined with one or more of the other examples.

Some examples of the disclosure are described below.

Example 1

A method for forming a semiconductor device, the method comprising:
forming an amorphous or polycrystalline semiconductor layer adjacently to at least one semiconductor doping region having a first conductivity type located in a semiconductor substrate;
incorporating dopants into the amorphous or polycrystalline semiconductor layer during or after forming the amorphous or polycrystalline semiconductor layer; and
annealing the amorphous or polycrystalline semiconductor layer to transform at least a part of the amorphous or polycrystalline semiconductor layer into a substantially monocrystalline semiconductor layer and to form at least one doping region having the second conductivity type in the monocrystalline semiconductor layer, such that a p-n junction is formed between the at least one semiconductor doping region having the first conductivity type and the at least one doping region having the second conductivity type.

Example 2

The method according to example 1, wherein a thickness of the amorphous or polycrystalline semiconductor layer is less than 500 nm.

Example 3

The method according to any combination of examples 1-2, wherein the dopants incorporated into the amorphous or polycrystalline semiconductor layer are phosphorus, antimony, selenium, nitrogen or arsenic dopants.

Example 4

The method according to any combination of examples 1-3, wherein the dopants incorporated into the amorphous or polycrystalline semiconductor layer are boron, aluminum or gallium dopants.

Example 5

The method according to any combination of examples 1-4, wherein the amorphous or polycrystalline semiconductor layer is annealed by light induced annealing.

Example 6

The method according to any combination of examples 1-5, wherein the light induced annealing is controlled such that an annealing depth caused by the light induced annealing is equal to or larger than a thickness of the amorphous or polycrystalline semiconductor layer.

Example 7

The method according to any combination of examples 1-6, wherein the light induced annealing is carried out by laser thermal annealing or flash lamp annealing.

Example 8

The method according to any combination of examples 1-7, wherein an energy density applied to the amorphous or polycrystalline semiconductor layer by the light induced annealing lies between 0.5 Joules per $cm^2$ and 10 Joules per $cm^2$.

Example 9

The method according to any combination of examples 1-8, wherein the light induced annealing is controlled to heat the amorphous or polycrystalline semiconductor layer within an annealing depth at a rate of at least 500° C. per 10 ms.

Example 10

The method according to any combination of examples 1-9, wherein the amorphous or polycrystalline semiconductor layer is annealed by the light induced annealing during a plurality of annealing time intervals to form the at least one doping region.

Example 11

The method according to any combination of examples 1-10, wherein the p-n junction is formed at a depth larger than a thickness of the amorphous or polycrystalline semiconductor layer if a doping concentration of the dopants incorporated into the at least one semiconductor doping region is greater than a doping concentration of dopants causing the first conductivity type of the at least one semiconductor doping region and if an annealing depth caused by the light induced annealing is larger than a thickness of the amorphous or polycrystalline semiconductor layer.

Example 12

The method according to any combination of examples 1-11, wherein the p-n junction is formed at an interface between the monocrystalline semiconductor layer and the at least one semiconductor doping region having the first conductivity type if a doping concentration of the dopants incorporated into the at least one semiconductor doping region is less than a doping concentration of dopants causing the first conductivity type of the at least one semiconductor doping region and if an annealing depth caused by the light induced annealing is at least equal to a thickness of the amorphous or polycrystalline semiconductor layer.

Example 13

The method according to any combination of examples 1-12, wherein more than 50% of the incorporated dopants are located at a depth equal to or less than a thickness of the amorphous or polycrystalline semiconductor layer after the incorporation of the dopants.

Example 14

The method according to any combination of examples 1-13, wherein the dopants are incorporated into the amorphous or polycrystalline semiconductor layer such that a doping concentration of the at least one doping region having the second conductivity type is at least $1*10^{17}$ dopants per $cm^3$.

Example 15

The method according to any combination of examples 1-14, wherein the amorphous or polycrystalline semiconductor layer is formed at a back side of the semiconductor substrate.

Example 16

The method according to any combination of examples 1-15, comprising:
  forming a second amorphous or polycrystalline semiconductor layer adjacently to the substantially monocrystalline semiconductor layer;
  incorporating dopants into the amorphous or polycrystalline semiconductor layer during or after forming the amorphous or polycrystalline semiconductor layer; and
  annealing the second amorphous or polycrystalline semiconductor layer to transform at least a part of the second amorphous or polycrystalline semiconductor layer into a second substantially monocrystalline semiconductor layer and to enlarge the at least one doping region having the second conductivity type into the monocrystalline semiconductor layer.

Example 17

The method according to any combination of examples 1-16, comprising:
  forming a second amorphous or polycrystalline semiconductor layer adjacently to the substantially monocrystalline semiconductor layer;
  incorporating dopants into the second amorphous or polycrystalline semiconductor layer during or after forming the second amorphous or polycrystalline semiconductor layer; and
  annealing the second amorphous or polycrystalline semiconductor layer to transform at least a part of the second amorphous or polycrystalline semiconductor layer into a second substantially monocrystalline semiconductor layer and to form at least one second doping region having the first conductivity type in the second substantially monocrystalline semiconductor layer, such that a second p-n junction is formed between the at least one doping region having the second conductivity type and the at least one second doping region having the first conductivity type.

Example 18

The method according to any combination of examples 1-17, wherein the at least one doping region having the second conductivity type is a source/drain or collector/emitter region of a field effect transistor structure and/or an anode/cathode region of a diode structure.

Example 19

The method according to any combination of examples 1-18, wherein the at least one semiconductor doping region having the first conductivity type is a drift region or a field stop region of a field effect transistor structure or a diode structure, or a tunneling region of a tunneling injection insulated gate bipolar transistor.

Example 20

The method according to any combination of examples 1-19, wherein the amorphous or polycrystalline semiconductor layer is formed adjacently to a plurality of laterally distributed semiconductor doping regions having the first conductivity type, wherein the plurality of laterally distributed semiconductor doping regions are separated from a drift region of a diode structure or a field effect transistor structure by a field stop region of the diode structure or the field effect transistor structure.

Example 21

The method according to any combination of examples 1-20, wherein the dopants are incorporated into the amorphous or polycrystalline semiconductor layer through a masking structure to form a plurality of doping regions in the amorphous or polycrystalline semiconductor layer.

Example 22

The method according to any combination of examples 1-21, further comprising heating the amorphous or polycrystalline semiconductor layer before annealing the amorphous or polycrystalline semiconductor layer such that outgassing occurs from the amorphous or polycrystalline semiconductor layer.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
    forming an amorphous or polycrystalline semiconductor layer adjacently to at least one semiconductor doping region having a first conductivity type located in a semiconductor substrate;
    incorporating dopants into the amorphous or polycrystalline semiconductor layer during or after forming the amorphous or polycrystalline semiconductor layer; and
    annealing the amorphous or polycrystalline semiconductor layer to transform at least a part of the amorphous or polycrystalline semiconductor layer into a substantially monocrystalline semiconductor layer and to form at least one doping region having the second conductivity type in the monocrystalline semiconductor layer, such that a p-n junction is formed between the at least one semiconductor doping region having the first conductivity type and the at least one doping region having the second conductivity type.

2. The method according to claim 1, wherein a thickness of the amorphous or polycrystalline semiconductor layer is less than 500 nm.

3. The method according to claim 1, wherein the dopants incorporated into the amorphous or polycrystalline semiconductor layer are phosphorus, antimony, selenium, nitrogen or arsenic dopants.

4. The method according to claim 1, wherein the dopants incorporated into the amorphous or polycrystalline semiconductor layer are boron, aluminum or gallium dopants.

5. The method according to claim 1, wherein the amorphous or polycrystalline semiconductor layer is annealed by light induced annealing.

6. The method according to claim 5, wherein the light induced annealing is controlled such that an annealing depth caused by the light induced annealing is equal to or larger than a thickness of the amorphous or polycrystalline semiconductor layer.

7. The method according to claim 5, wherein the light induced annealing is carried out by laser thermal annealing or flash lamp annealing.

8. The method according to claim 5, wherein an energy density applied to the amorphous or polycrystalline semiconductor layer by the light induced annealing lies between 0.5 Joules per $cm^2$ and 10 Joules per $cm^2$.

9. The method according to claim 5, wherein the light induced annealing is controlled to heat the amorphous or polycrystalline semiconductor layer within an annealing depth at a rate of at least 500° C. per 10 ms.

10. The method according to claim 5, wherein the amorphous or polycrystalline semiconductor layer is annealed by the light induced annealing during a plurality of annealing time intervals to form the at least one doping region.

11. The method according to claim 5, wherein the p-n junction is formed at a depth larger than a thickness of the amorphous or polycrystalline semiconductor layer if a doping concentration of the dopants incorporated into the at least one semiconductor doping region is greater than a doping concentration of dopants causing the first conductivity type of the at least one semiconductor doping region and if an annealing depth caused by the light induced annealing is larger than a thickness of the amorphous or polycrystalline semiconductor layer.

12. The method according to claim 5, wherein the p-n junction is formed at an interface between the monocrystalline semiconductor layer and the at least one semiconductor doping region having the first conductivity type if a doping concentration of the dopants incorporated into the at least one semiconductor doping region is less than a doping concentration of dopants causing the first conductivity type of the at least one semiconductor doping region and if an annealing depth caused by the light induced annealing is at least equal to a thickness of the amorphous or polycrystalline semiconductor layer.

13. The method according to claim 1, wherein more than 50% of the incorporated dopants are located at a depth equal to or less than a thickness of the amorphous or polycrystalline semiconductor layer after the incorporation of the dopants.

14. The method according to claim 1, wherein the dopants are incorporated into the amorphous or polycrystalline semiconductor layer such that a doping concentration of the at least one doping region having the second conductivity type is at least $1*10^{17}$ dopants per $cm^3$.

15. The method according to claim 1, wherein the amorphous or polycrystalline semiconductor layer is formed at a back side of the semiconductor substrate.

16. The method according to claim 1, comprising:
forming a second amorphous or polycrystalline semiconductor layer adjacently to the substantially monocrystalline semiconductor layer;
incorporating dopants into the amorphous or polycrystalline semiconductor layer during or after forming the amorphous or polycrystalline semiconductor layer; and
annealing the second amorphous or polycrystalline semiconductor layer to transform at least a part of the second amorphous or polycrystalline semiconductor layer into a second substantially monocrystalline semiconductor layer and to enlarge the at least one doping region having the second conductivity type into the monocrystalline semiconductor layer.

17. The method according to claim 1, comprising:
forming a second amorphous or polycrystalline semiconductor layer adjacently to the substantially monocrystalline semiconductor layer;
incorporating dopants into the second amorphous or polycrystalline semiconductor layer during or after forming the second amorphous or polycrystalline semiconductor layer; and
annealing the second amorphous or polycrystalline semiconductor layer to transform at least a part of the second amorphous or polycrystalline semiconductor layer into a second substantially monocrystalline semiconductor layer and to form at least one second doping region having the first conductivity type in the second substantially monocrystalline semiconductor layer, such that a second p-n junction is formed between the at least one doping region having the second conductivity type and the at least one second doping region having the first conductivity type.

18. The method according to claim 1, wherein the at least one doping region having the second conductivity type is a source/drain or collector/emitter region of a field effect transistor structure and/or an anode/cathode region of a diode structure.

19. The method according to claim 1, wherein the at least one semiconductor doping region having the first conductivity type is a drift region or a field stop region of a field effect transistor structure or a diode structure, or a tunneling region of a tunneling injection insulated gate bipolar transistor.

20. The method according to claim 1, wherein the amorphous or polycrystalline semiconductor layer is formed adjacently to a plurality of laterally distributed semiconductor doping regions having the first conductivity type, wherein the plurality of laterally distributed semiconductor doping regions are separated from a drift region of a diode structure or a field effect transistor structure by a field stop region of the diode structure or the field effect transistor structure.

21. The method according to claim 1, wherein the dopants are incorporated into the amorphous or polycrystalline semiconductor layer through a masking structure to form a plurality of doping regions in the amorphous or polycrystalline semiconductor layer.

22. The method according to claim 1, further comprising heating the amorphous or polycrystalline semiconductor layer before annealing the amorphous or polycrystalline semiconductor layer such that outgassing occurs from the amorphous or polycrystalline semiconductor layer.

* * * * *